US006229151B1

United States Patent
Takeuchi et al.

(10) Patent No.: US 6,229,151 B1
(45) Date of Patent: May 8, 2001

(54) GROUP III-V SEMICONDUCTOR LIGHT EMITTING DEVICES WITH REDUCED PIEZOELECTRIC FIELDS AND INCREASED EFFICIENCY

(75) Inventors: Tetsuya Takeuchi, Kanagawa; Norihide Yamada, Tokyo; Hiroshi Amano; Isamu Akasaki, both of Aichi, all of (JP)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/162,708

(22) Filed: Sep. 29, 1998

(30) Foreign Application Priority Data

Sep. 30, 1997 (JP) ..................................... 9-265311

(51) Int. Cl.$^7$ .............................. H01L 29/06; H01L 33/00
(52) U.S. Cl. ................................. 257/14; 257/15; 257/18; 257/22; 257/96; 257/103; 257/627
(58) Field of Search ................................. 257/14, 15, 18, 257/22, 94, 96, 103, 627, 628; 372/45, 43

(56) References Cited

FOREIGN PATENT DOCUMENTS

| 0 716 457 | 6/1996 | (EP) | .............................. H01L/33/00 |
| 0 743 727 | 11/1996 | (EP) | ................................ H01S/3/19 |
| WO 96/24167 | 8/1996 | (WO) | ............................. H01L/33/00 |

OTHER PUBLICATIONS

Niwa, Atsuko, et al., "Valence Subband Structures of (1010)–GaN/AlGaN Strained Quantum Wells Calculated by the Tight–Binding Method", Appl. Phys. Letters, vol. 70, No. 16, Apr. 21, 1997, pp. 2159–2161.

Ishibashi, Akihiko, "Matalorganic Vapor Phase Epitaxy Growth of a High–Quality GaN/InGaN Single Quantum Well Structure Using a Misoriented SiC Substrate", Japan Journal of Appl. Phys. vol. 36, Part 1, No. 3B, Mar. 1997, pp. 1961–1965.

T. Takeuchi et al., "Quantum–Confined Stark Effect due to Piczoelectric Fields in GaInN Strained Quantum Wells", Japan J. Apl. Phys., vol. 36(1997), L–382–L385.

D. A. B. Miller et al., "Band–Edge Electroabsorption in Quantum Well Structures: The Quantum–Confined Stark Effect", Phys. Rev. Lett. 53, No. 22, (1984), p. 2173–2176.

K. Domen et al., "Optical Gain for Wurtzite GaN with Anisotropic Strain in c Plane", Appl. Phys. Lett. 70(1997), p. 987–989.

D. L. Smith and C. Mailhoit, "Piezoelectric Effects in Strained–Layer Superlattices", J. Appl. Phys., vol. 63, No. 8(1998), p. 2717–2719.

Primary Examiner—Minh Loan Tran

(57) ABSTRACT

An optical semiconductor device having a plurality of GaN-based semiconductor layers containing a strained quantum well layer in which the strained quantum well layer has a piezoelectric field that depends on the orientation of the strained quantum well layer when the quantum layer is grown. In the present invention, the strained quantum well layer is grown with an orientation at which the piezoelectric field is less than the maximum value of the piezoelectric field strength as a function of the orientation. In devices having GaN-based semiconductor layers with a wurtzite crystal structure, the growth orientation of the strained quantum well layer is tilted at least 1° from the {0001} direction of the wurtzite crystal structure. In devices having GaN-based semiconductor layers with a zincblende crystal structure, the growth orientation of the strained quantum well layer is tilted at least 1° from the {111} direction of the zincblende crystal structure. In the preferred embodiment of the present invention, the growth orientation is chosen to minimize the piezoelectric field in the strained quantum well layer.

6 Claims, 7 Drawing Sheets

GROUP III-V SEMICONDUCTOR LIGHT EMITTING DEVICES WITH REDUCED PIEZOELECTRIC FIELDS AND INCREASED EFFICIENCY

FIELD OF THE INVENTION

The present invention relates to optical semiconductor devices, and particularly, to a structure for improving the efficiency of light emitters and photodetectors fabricated from GaN-based semiconductors.

BACKGROUND OF THE INVENTION

In the following discussion a III-N semiconductor is a semiconductor having a Group III element and nitrogen. III-N semiconductors such as GaN are useful in fabricating light emitting elements that emit in the blue and violet regions of the optical spectrum. These elements include light emitting diodes and laser diodes. Laser diodes that use semiconductor material based on GaN that emit in the blue and violet regions of the spectrum hold the promise of substantially improving the amount of information that can be stored on an optical disk. However, higher efficiencies are needed for both semiconductor light emitters and photodetectors. This is a particularly urgent problem in GaN-based optical semiconductor devices using BN, AlN, GaN, or InN, which are compounds of nitrogen and Group III elements such as B, Al, Ga, and In and their mixed crystal semiconductors (hereinafter, called GaN-based semiconductors).

Light emitting elements based on III-N semiconductors are typically fabricated by creating a p-n diode structure having a light generating region between the p-type and n-type layers. The diode is constructed from layers of III-N semiconducting materials. After the appropriate layers are grown, electrodes are formed on the p-type and n-type layers to provide the electrical connections for driving the light-emitting element.

One class of blue and green light-emitting diodes (LEDs) or short-wavelength laser diodes (LDs) use GaInN/GaN strained quantum wells or GaInN/GaInN strained quantum wells located between the n-type and p-type layers to generate light by the recombination of holes and electrons injected from these layers. In prior art devices, a strained GaN-based semiconductor layer is constructed by growing a {0001} plane of a normal GaN-based crystal. The resulting layer has a large piezoelectric field. For example, in a $Ga_{0.9}In_{0.1}N$ strained layer, an extremely large piezoelectric field of around 1 MV/cm is generated.

Usually, when an electric field exists in a quantum well, the energy band of the quantum well layer tends to tilt substantially as the electric field increases. As a result, the wave functions of the electrons and holes separate from one another, and the overlap integrals of both wave functions decrease. Since the optical properties such as the light emission and absorption efficiencies depend on these overlap integrals, the efficiency of these devices decreases with increasing electric fields.

Broadly, it is the object of the present invention to provide an improved III-N semiconductor device in which the efficiency of light generation or detection is increased relative to prior art devices.

It is a further object of the present invention to provide a strained quantum well layer having a reduced piezoelectric field.

These and other objects of the present invention will become apparent to those skilled in the art from the following detailed description of the invention and the accompanying drawings.

SUMMARY OF THE INVENTION

The present invention is an optical semiconductor device having a plurality of GaN-based semiconductor layers containing a strained quantum well layer in which the strained quantum well layer has a piezoelectric field that depends on the orientation of the strained quantum well layer when the quantum layer is grown. In the present invention, the strained quantum well layer is grown with an orientation at which the piezoelectric field is less than the maximum value of the piezoelectric field strength as a function of the orientation. In devices having GaN-based semiconductor layers with a wurtzite crystal structure, the growth orientation of the strained quantum well layer is tilted at least 1° from the {0001} direction of the wurtzite crystal structure. In devices having GaN-based semiconductor layers with a zincblende crystal structure, the growth orientation of the strained quantum well layer is tilted at least 1° from the {111} direction of the zincblende crystal structure. In the preferred embodiment of the present invention, the growth orientation is chosen to minimize the piezoelectric field in the strained quantum well layer.

DETAILED DESCRIPTION OF THE INVENTION

The present invention is based on the observation that the piezoelectric field in a strained quantum well layer depends on the orientation of the crystal structure of the quantum well layer, and hence, by controlling the facet orientation, the piezoelectric field can be minimized. The manner in which this is accomplished may be more easily understood with reference to two types of strained quantum well structures, those based on a wurtzite crystal structure and those based on a zincblende crystal structure.

Figure 1:
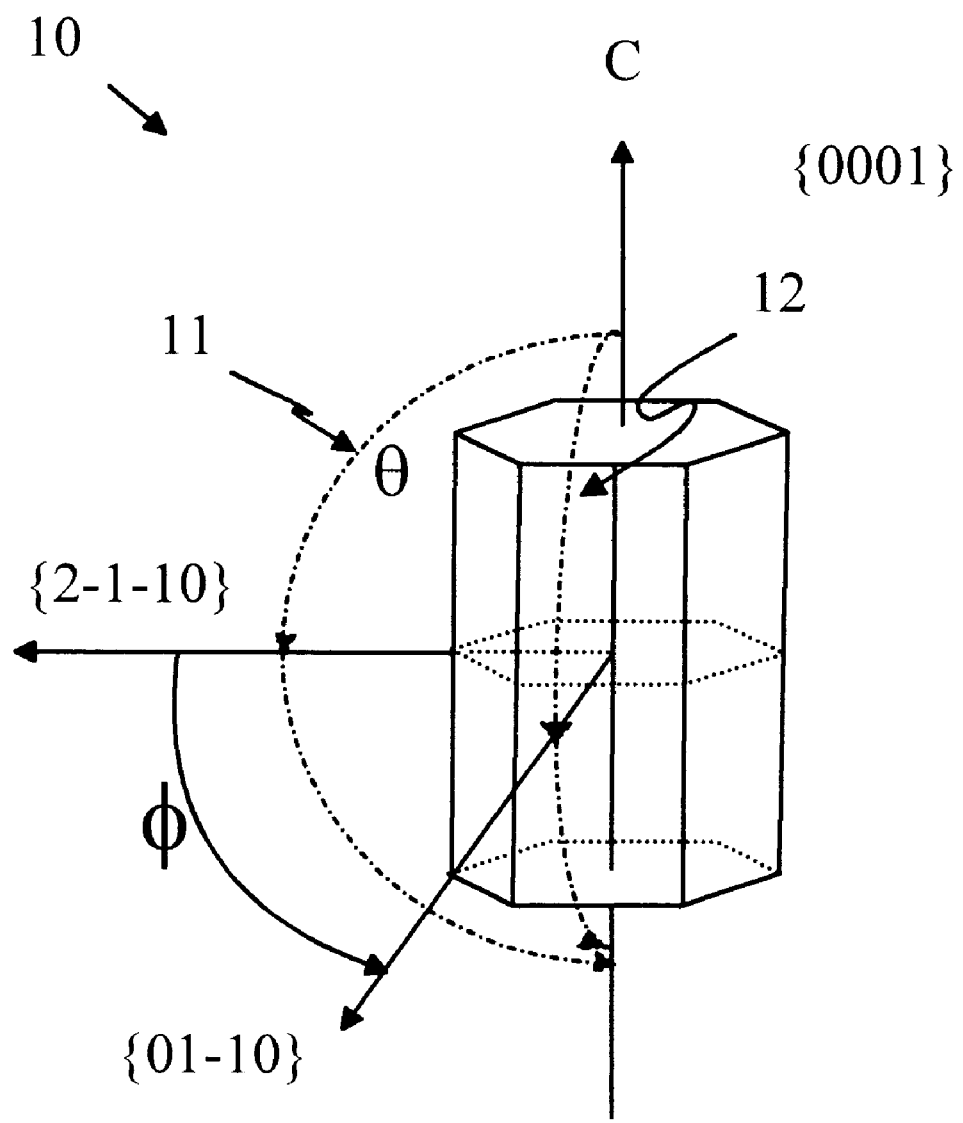
FIG. 1 illustrates the crystal structure of a WZ-GaN-based semiconductor.
Figure 2:
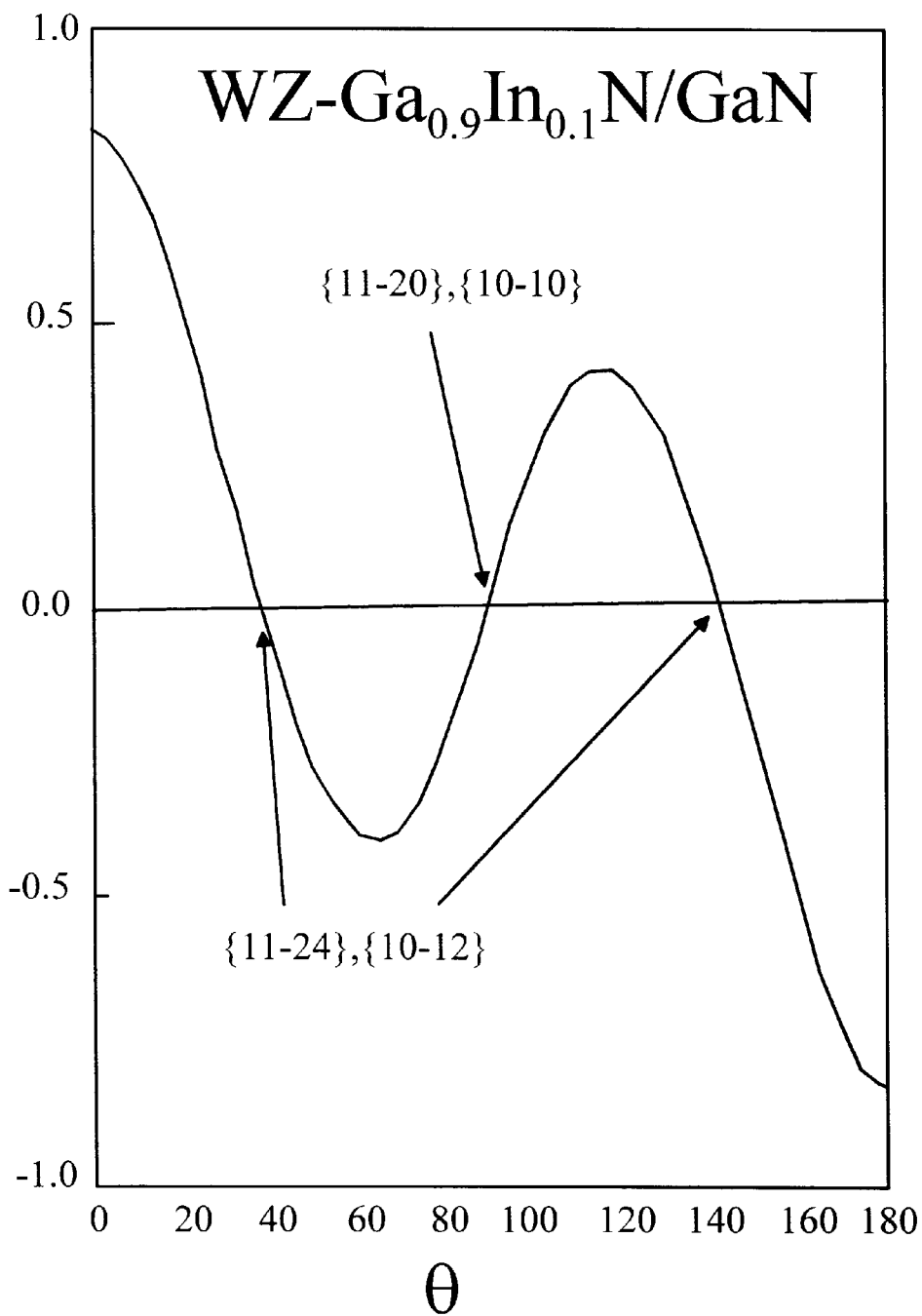
FIG. 2 is a graph of the piezoelectric field generated in the quantum well with respect to the growth orientation of the WZ-GaN-based semiconductor quantum well.

Refer now to FIG. 1 which illustrates a wurtzite crystal GaN (WZ-GaN) structure 10. The piezoelectric field generated in a crystal having a facet orientation along arc 11 in FIG. 1 is shown in FIG. 2 as a function of the angle θ between the {0001} direction and the facet orientation. The data shown in FIG. 2 is for $Ga_{0.9}In_{0.1}N$ strained quantum well layers. The piezoelectric field reaches maxima in the {0001} direction or the {000-1} direction, and has three orientations at which the piezoelectric field is zero. The same result is obtained for other arcs, e.g., arc 12. That is, the piezoelectric field is uniquely determined by the difference in the angle between the {0001} direction and the facet orientation of the concerned plane, i.e, the piezoelectric field is independent $\phi$.

Hence it is clear from FIG. 2 that there are three sets of planes for which there is no piezoelectric field. For example, the planes at 90° to the C-axis, i.e., the A-plane, {2-1-10}, the M plane {0-110}, etc. The planes around 40° and 140° to the C-axis also provide planes with a zero piezoelectric field, i.e., the R planes {2-1-14}, {01-12}, etc.

The strength of the piezoelectric field depends on the composition of the GaInN strained quantum well layer. However, the plane orientations in which the field is zero are, at most, only slightly altered. In particular, the 90° facet orientation measured from the {0001} direction where the piezoelectric field becomes 0 does not depend on the ratio of Ga to In. The plane orientations corresponding to the 40° and 140° orientations discussed above change by no more than a maximum of 5° from the 40° and 140° values determined for the composition shown in FIG. 2.

Figure 3:
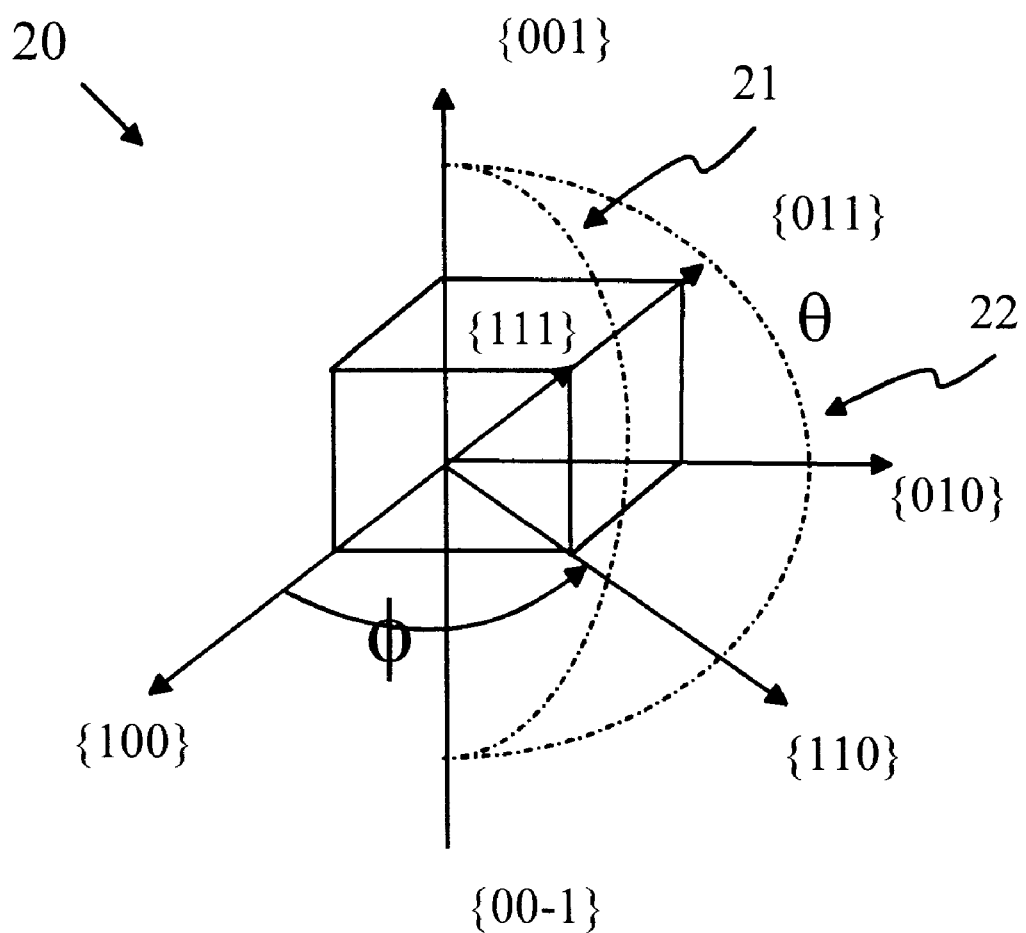
FIG. 3 illustrates the crystal structure of a ZB-GaN-based semiconductor.

A similar analysis can be applied to other crystal structures. Consider a zincblende crystal structure GaN-based semiconductor layer, referred to as ZB-GaN in the following discussion. A ZB-$Ga_{0.9}In_{0.1}N$ strained quantum well layer can be formed on GaN in a manner analogous to the WZ-GaN-based semiconductor strained quantum well layer discussed above. FIG. 3 shows the crystal structure 20 of the ZB-GaN-based semiconductor. To simplify the discussion, the spherical coordinate system used with reference to FIG. 1 will also be used here. The radius vector has a polar angle $\theta$ measured from the {001} direction and a cone angle, $\phi$, about the {001} direction. First and second paths having a constant azimuth angle $\phi$ are shown at 21 and 22.

Figure 4:
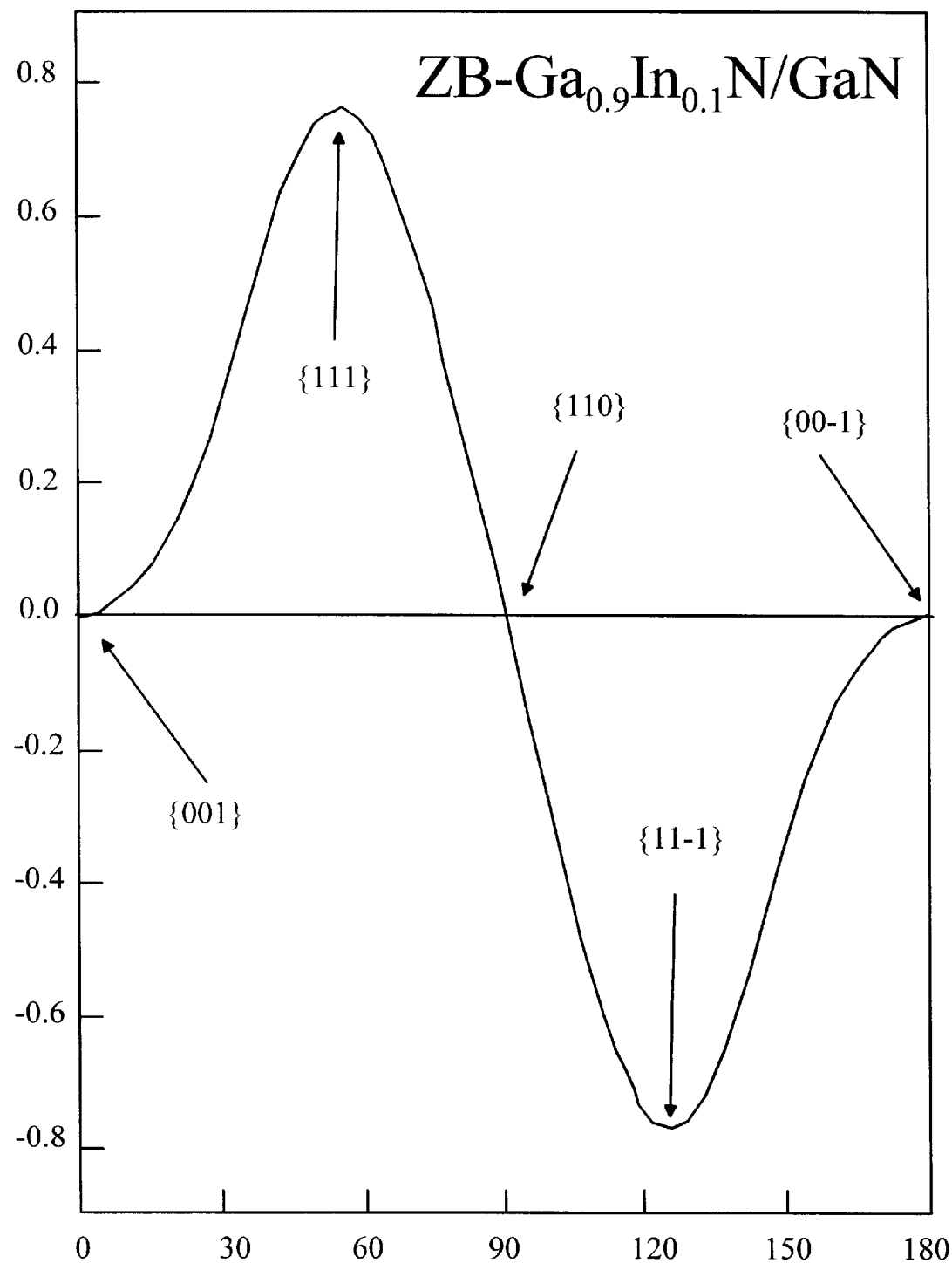
FIG. 4 is a graph of the piezoelectric field strength generated in the quantum well with respect to the first path shown in FIG. 3.

Refer now to FIG. 4, which is a plot of the piezoelectric field in the strained quantum well layer with respect to the polar angle $\theta$ for various orientations of the strained quantum well layer on path 21. In FIG. 4, $\phi=45°$ and the {001} direction corresponds to $\theta=0°$. The {111} direction corresponds to $\theta=54.7°$, the {110} direction corresponds to $\theta=90°$, and the {11-1} direction corresponds to $\theta=125.3°$. It is clear from FIG. 4, that the piezoelectric field has maxima in the {111} direction ($\theta$ around 55°) and the {11-1} direction ($\theta$ around 125°). More importantly, the piezoelectric field goes to zero for $\theta=0, 90°$, and 180°.

A similar analysis with respect to path 22 shows that the piezoelectric field is essentially 0 for all points along this path. Path 22 corresponds to a $Ga_{0.9}In_{0.1}N$ strained quantum well layer in which the growth orientation corresponds to $\theta$ and $\phi=90°$. Hence, in a strained quantum well crystal of ZB-GaN-based semiconductor, almost no piezoelectric field is generated in the strained quantum well layer that has growth planes beginning in the {001} plane or {011} plane and a facet orientation angle $\theta$ on path 22. A similar result holds for planes that are equivalent to these.

Figure 5:
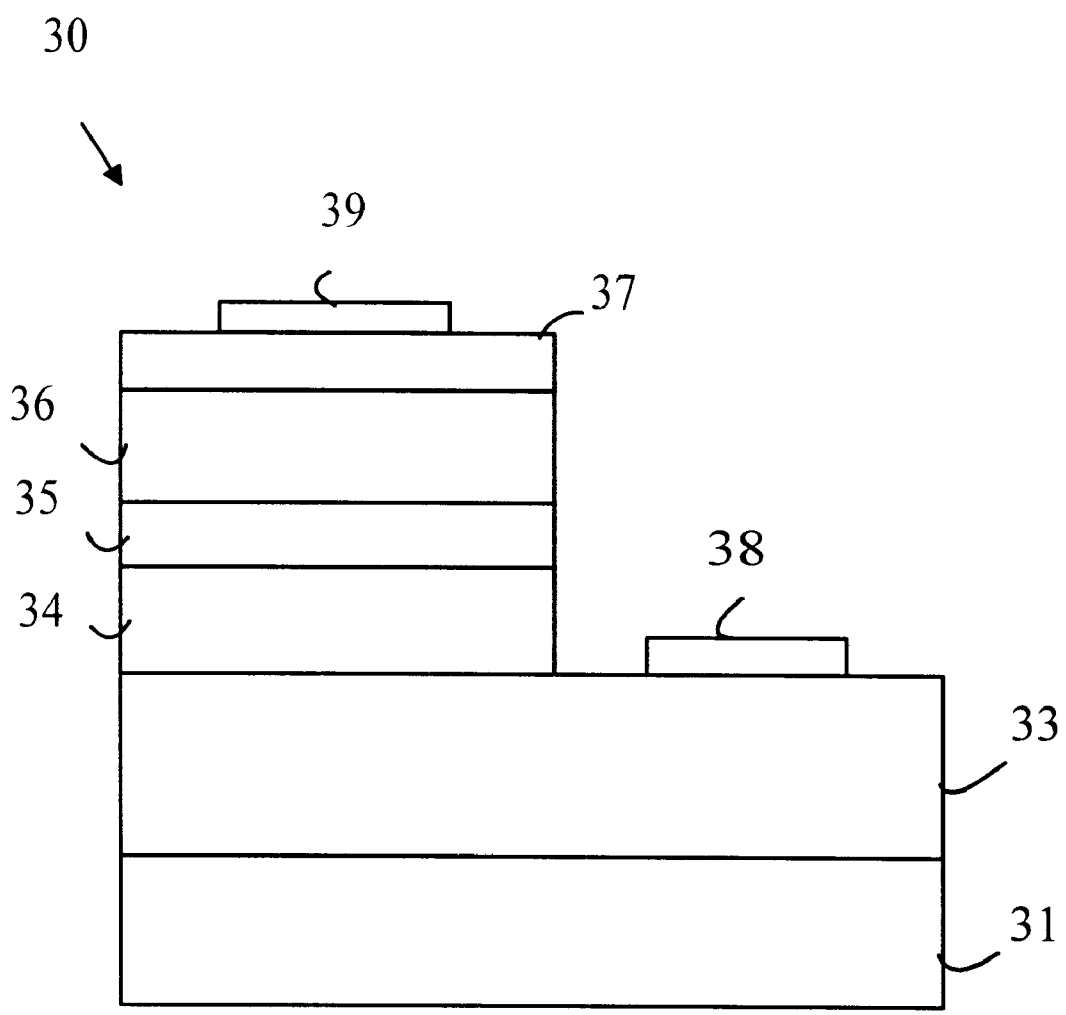
FIG. 5 is a cross-sectional view of an edge emitting laser diode according to one embodiment of the present invention.

The manner in which the above-described observations are used in the fabrication of a light emitter will now be explained with the aid of FIG. 5 which is a cross-sectional view of a laser 30 according to the present invention. If the crystal growth orientation is excluded, the composition of each deposited layer is essentially that used in a conventional laser diode.

Laser 30 is constructed from a number of layers. An n-type GaN contact layer 33, an n-type AlGaN cladding layer 34, a strained multiple quantum well layer 35, a p-type AlGaN cladding layer 36, and a p-type GaN contact layer 37 are successively deposited on a substrate 31 which is typically, sapphire, SiC, or GaN. An n-electrode 38 and a p-electrode 39 are deposited as shown.

The strained multiple quantum well layer 35 is typically constructed from GaInN/GaN or GaInN/GaInN. In a laser diode according to the present invention, the layers of the quantum well are caused to grow such that the piezoelectric field generated by the layers is negligible. In conventional laser diodes, the {0001} plane of a sapphire substrate is used to grow the various layers. As noted above, this leads to a high piezoelectric field and poor efficiency.

As noted above, there are a number of planes for which the piezoelectric field is substantially zero. One of these is utilized in a laser diode according to the present invention. The particular plane will depend on the type of crystal. For example, in the case of a WZ-GAN light emitter, the {2-1-10} plane of the strained quantum layer material can be caused to grow by selecting the appropriate growing surface of substrate 31. If the substrate is sapphire, the sapphire is cut such that the {01-12} plane is used for growing layer 33. In the case of SiC, the {2-1-10} plane is used. In the preferred embodiment of the present invention, SiC with a growth plane of {2-1-10} is preferred.

Figure 6:
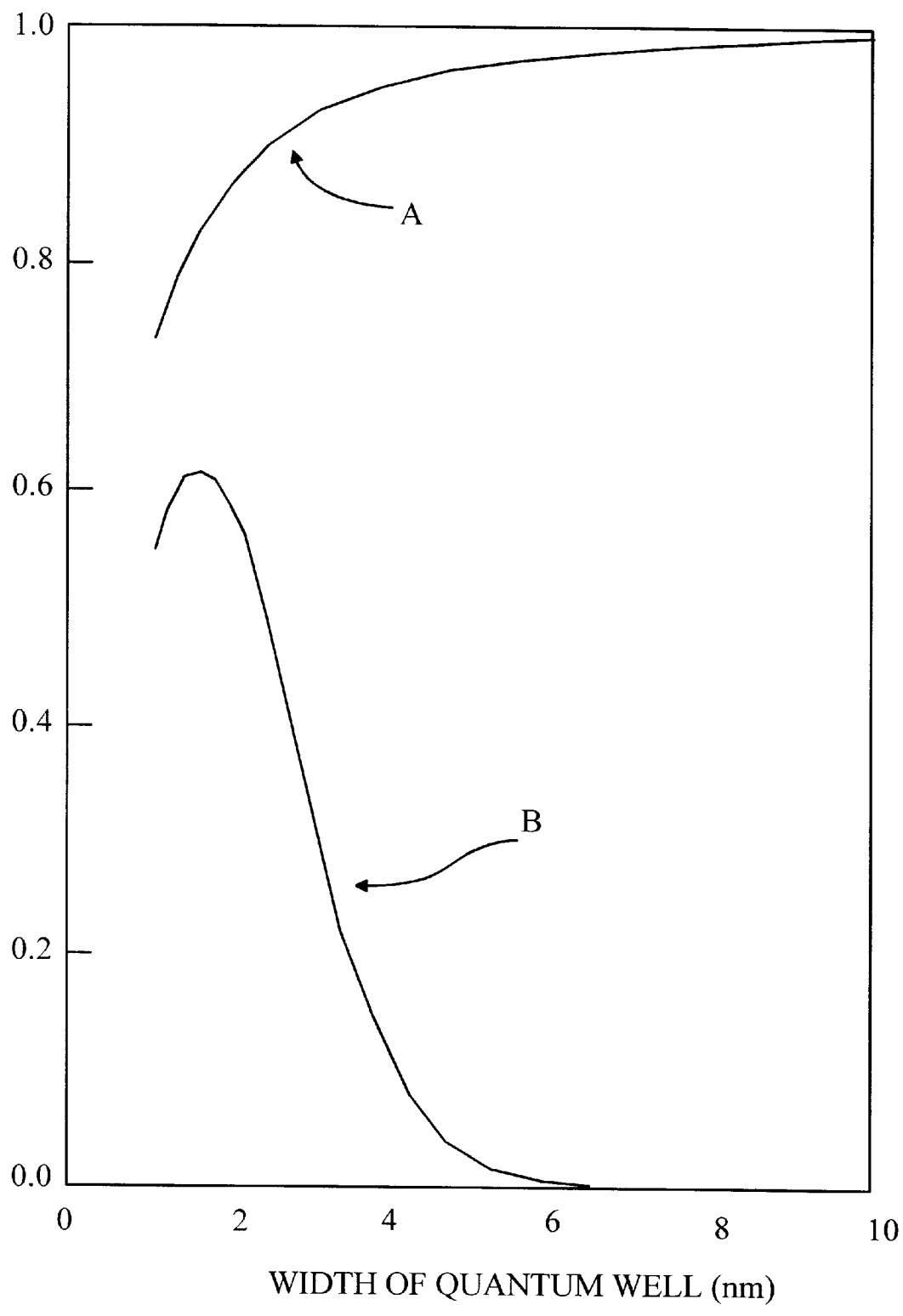
FIG. 6 is a graph of the relative light generation efficiency of quantum wells in a semiconductor device of the present invention and a prior art semiconductor device as functions of the well width.

The relative efficiency of a laser diode according to the present invention and a conventional laser diode grown on the {0001} plane of a sapphire substrate is shown in FIG. 6 as a function of the width of the quantum well. Curve A is the efficiency for the device discussed above with reference to FIG. 5, and curve B is the efficiency of the conventional device. It will be appreciated from this figure that the present invention provides a substantial improvement in the efficiency of light generation.

The present invention may also be utilized to provide improved performance from photodetectors. Photodetectors fabricated by growing the device on the {0001} plane of a sapphire substrate exhibit an efficiency and absorption band that depend on light intensity. In particular, the efficiency of conversion increases with light intensity while the useful wavelength range decreases, In a photodetector according to the present invention, the device is grown on a substrate that results in little or no piezoelectric field in the strained quantum well layer. Hence, the increase in efficiency and decrease in absorption band are substantially reduced or eliminated. In general, the growing technique for a photodetector is the same as that used to construct a light emitter; however, thicker strained quantum well layers are utilized to improve the absorption of the incident light.

Figure 7:
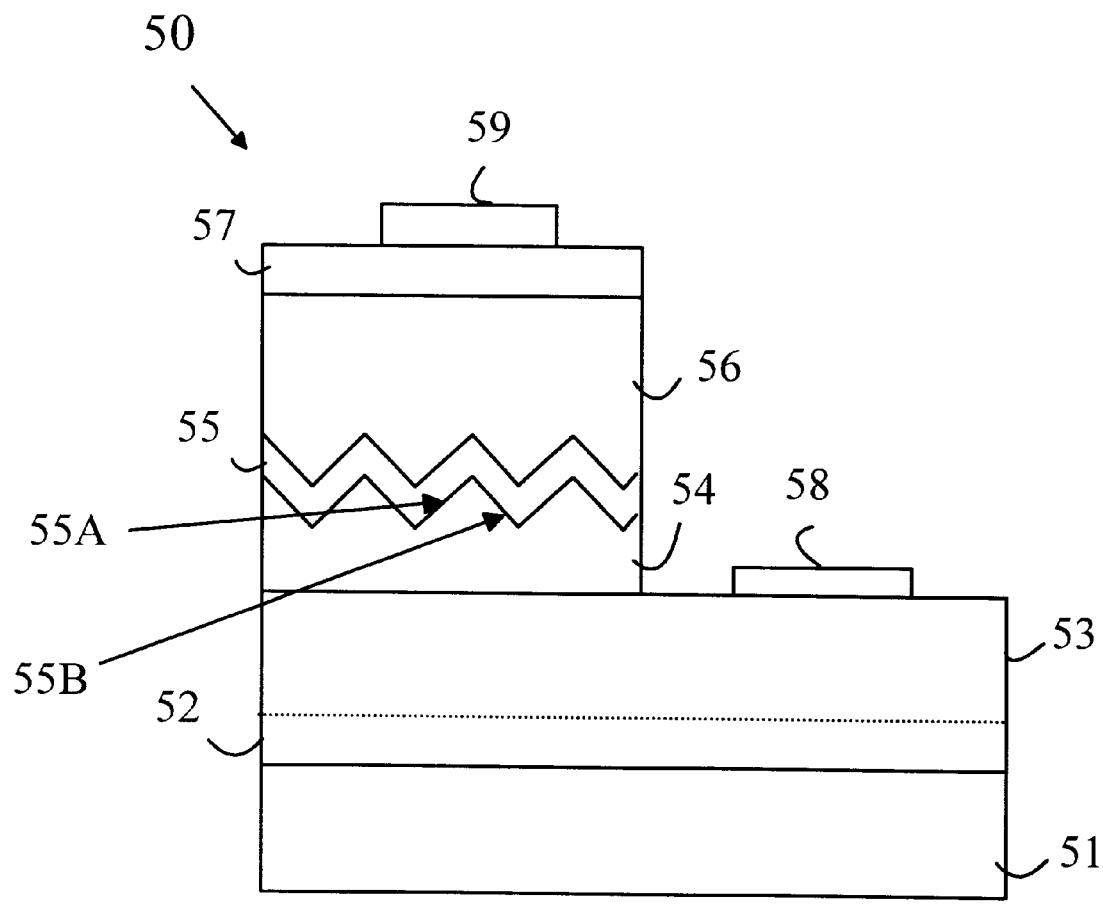
FIG. 7 is a cross-sectional view of an edge emitting laser diode according to a second embodiment of the present invention.

It would be advantageous in many circumstances to utilize a sapphire or SiC substrate in which the layers, except for strained quantum wells, are grown on the {0001} plane, since substrates cut to provide growth on a {0001} plane are commercially available. Refer now to FIG. 7 which is a cross-sectional view of the optical semiconductor device 50 according to another embodiment of the present invention in which only the layers related solely to light emission and absorption have the desired facet orientation. Device 50 is constructed by growing an n-type GaN contact layer 53 and an n-type AlGaN cladding layer 54 on the {0001} plane orientation on the substrate 51 such as SiC or GaN based on conventional technology. Next, by selective growing or selective etching, the {2-1-14} plane or {01-12} plane is formed. The GaInN/GaN or GaInN/GaInN strained multiple quantum well layer 55 is then formed by repeating the crystal growth.

Next, the remaining p-type AlGaN cladding layer 56 and the p-type GaN contact layer 57 are successively deposited and formed. The p-type AlGaN cladding layer 56 and the p-type GaN contact layer 57 change the crystal structure back to that corresponding to the {0001} plane from the facet orientation of the well layer 55 and become layers with specific thicknesses. The n-electrode 58 and the p-electrode 59 are formed as the electrodes on the n-type GaN contact layer 53 and the p-type GaN contact layer 57, respectively. The growing surfaces 55A, 55B on both sides of the GaInN strained multiple quantum well layer 55 are the {01-12} plane or the {2-1-14} plane. The p-type AlGaN cladding layer 56 and the p-type GaN contact layer 57 become flat growing surfaces. To simplify the next process, it is advisable that they be several microns thick. In the preferred embodiment of the present invention, an AlN buffer layer 52 is grown on the substrate 51.

As noted above, the specific plane selected for growing the quantum well layer depends on the crystal type. In WZ-GaN-based optical semiconductor devices, the {0001} plane may be utilized, since this plane has excellent crystal quality and generates almost no piezoelectric field. For devices based on different compound semiconductors such as AlN, it can be shown that the piezoelectric field as a function of the facet orientation behaves similarly to that described above if the crystal type is the same. The orientation inclination, θ, for which the piezoelectric field of 0 may, however, change by as much as 10°.

Various modifications to the present invention will become apparent to those skilled in the art from the foregoing description and accompanying drawings. Accordingly, the present invention is to be limited solely by the scope of the following claims.

What is claimed is:

1. In an optical semiconductor device having a plurality of GaN-based semiconductor layers containing a strained quantum well layer, said strained quantum well layer having a piezoelectric field therein having a field strength that depends on the orientation of said strained quantum well layer when said quantum layer is grown, the improvement comprising growing said strained quantum well layer with an orientation at which said piezoelectric field is less than half the maximum value of said piezoelectric field strength as a function of said orientation.

2. The optical semiconductor device of claim 1 wherein said GaN-based semiconductor layers have a wurtzite crystal structure and wherein said growth orientation of said strained quantum well layer is tilted at least 10 degrees from the {0001} direction of said wurtzite crystal structure.

3. The optical semiconductor device of claim 2 wherein at least one other layer of said GaN-based semiconductor has a growth orientation in the {0001} direction.

4. The optical semiconductor device of claim 2 wherein said strained quantum well layer is tilted at 40°, 90°, or 140° from said {0001} direction.

5. In an optical semiconductor device having a plurality of GaN-based semiconductor layers containing a strained quantum well layer, said strained quantum well layer having a piezoelectric field therein having a field strength that depends on the orientation of said strained quantum well layer when said quantum layer is grown, the improvement comprising growing said strained quantum well layer with an orientation at which said piezoelectric field is less than the maximum value of said piezoelectric field strength as a function of said orientation, wherein said GaN-based semiconductor layers have a zincblende crystal structure and wherein said growth orientation of said strained quantum well layer is tilted at least 1° from the { 111} direction of said zincblende crystal structure.

6. The optical semiconductor device of claim 5 wherein at least one other layer of said GaN-based semiconductor has a growth orientation in the { 111} direction.

* * * * *